(12) United States Patent
Matsuoka

(10) Patent No.: US 8,767,486 B2
(45) Date of Patent: Jul. 1, 2014

(54) OUTPUT DRIVER CIRCUIT, OUTPUT DRIVER SYSTEM AND SEMICONDUCTOR MEMORY DEVICE

(75) Inventor: Fumiyoshi Matsuoka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 13/424,813

(22) Filed: Mar. 20, 2012

(65) Prior Publication Data
US 2012/0243345 A1 Sep. 27, 2012

(30) Foreign Application Priority Data

Mar. 25, 2011 (JP) .................................. 2011-68711

(51) Int. Cl.
*G11C 7/00* (2006.01)
*G11C 29/02* (2006.01)

(52) U.S. Cl.
CPC .................................. *G11C 29/022* (2013.01)
USPC .................................. 365/189.14; 365/189.15

(58) Field of Classification Search
CPC ..................... G11C 29/022; G11C 2207/2254; H03K 19/0005
USPC .................. 365/189.14, 189.15, 189.11
See application file for complete search history.

(56) References Cited

U.S. PATENT DOCUMENTS

| 2007/0152704 A1* | 7/2007 | Park .................................. 326/30 |
| 2009/0295426 A1* | 12/2009 | Ayyapureddi et al. .......... 326/30 |
| 2011/0133792 A1 | 6/2011 | Koyanagi et al. |
| 2011/0267112 A1* | 11/2011 | Lee et al. ....................... 327/108 |

OTHER PUBLICATIONS

Churoo Park et al. "A 512-Mb DDR3 SDRAM Prototype with Clo Minimization and Self-Calibration Techniques" IEEE Journal of Solid State Circuits, vol. 41, No. 4, pp. 831-838, Apr. 2006.
Fujisawa, H. et al., An 8.1-ns Column-Access 1.6Gb/s/pin DDR3 SDRAM with an 8:4 Multiplexed Data-Transfer Scheme: IEEE Journal of Solid-State Circuits, vol. 42, No. 1, pp. 201-209, Jan. 2007.

* cited by examiner

*Primary Examiner* — Vu Le
(74) *Attorney, Agent, or Firm* — Knobbe, Martens, Olson & Bear, LLP

(57) ABSTRACT

The output driver circuit includes a plurality of pull-up sub-drivers that pull up a voltage at the output terminal according to a pull-up signal based on the output data. The output driver circuit includes a plurality of pull-down sub-drivers that pull down the voltage at the output terminal according to a pull-down signal based on the output data. Selection from among the pull-up sub-drivers is made by an assigned pull-up calibration signal and selection from among the pull-down sub-drivers by an assigned pull-down calibration signal so as to make a pull-up current drivability and a pull-down current drivability for the voltage at the output terminal equal. A timing of turning on of the pull-up sub-drivers is calibrated by the pull-down calibration signal. A timing of turning on of the pull-down sub-drivers is calibrated by the pull-up calibration signal.

18 Claims, 10 Drawing Sheets

OUTPUT DRIVER CIRCUIT, OUTPUT DRIVER SYSTEM AND SEMICONDUCTOR MEMORY DEVICE

CROSS-REFERENCE TO RELATED APPLICATION

This application is based upon and claims the benefit of priority from the prior Japanese Patent Application No. 2011-68711, filed on Mar. 25, 2011, the entire contents of which are incorporated herein by reference.

BACKGROUND

1. Field

Embodiments described herein relate generally to an output driver circuit, an output driver system and a semiconductor memory device.

2. Background Art

To improve access efficiency, recent semiconductor memory devices, such as DRAM, use the double data rate (DDR) technique, which allows an interface circuit to input and output data at both the rising and falling edges of the clock.

The semiconductor memory devices of this type can achieve high speed operation.

DETAILED DESCRIPTION

An output driver circuit according to an embodiment that outputs, at an output terminal, a data signal responsive to output data read from a memory core. The output driver circuit includes a plurality of pull-up sub-drivers that pull up a voltage at the output terminal according to a pull-up signal based on the output data. The output driver circuit includes a plurality of pull-down sub-drivers that pull down the voltage at the output terminal according to a pull-down signal based on the output data.

Selection from among the pull-up sub-drivers is made by an assigned pull-up calibration signal and selection from among the pull-down sub-drivers by an assigned pull-down calibration signal so as to make a pull-up current drivability and a pull-down current drivability for the voltage at the output terminal equal to each other.

A timing of turning on of the pull-up sub-drivers is calibrated by the pull-down calibration signal.

A timing of turning on of the pull-down sub-drivers is calibrated by the pull-up calibration signal.

COMPARATIVE EXAMPLE

Figure 1:
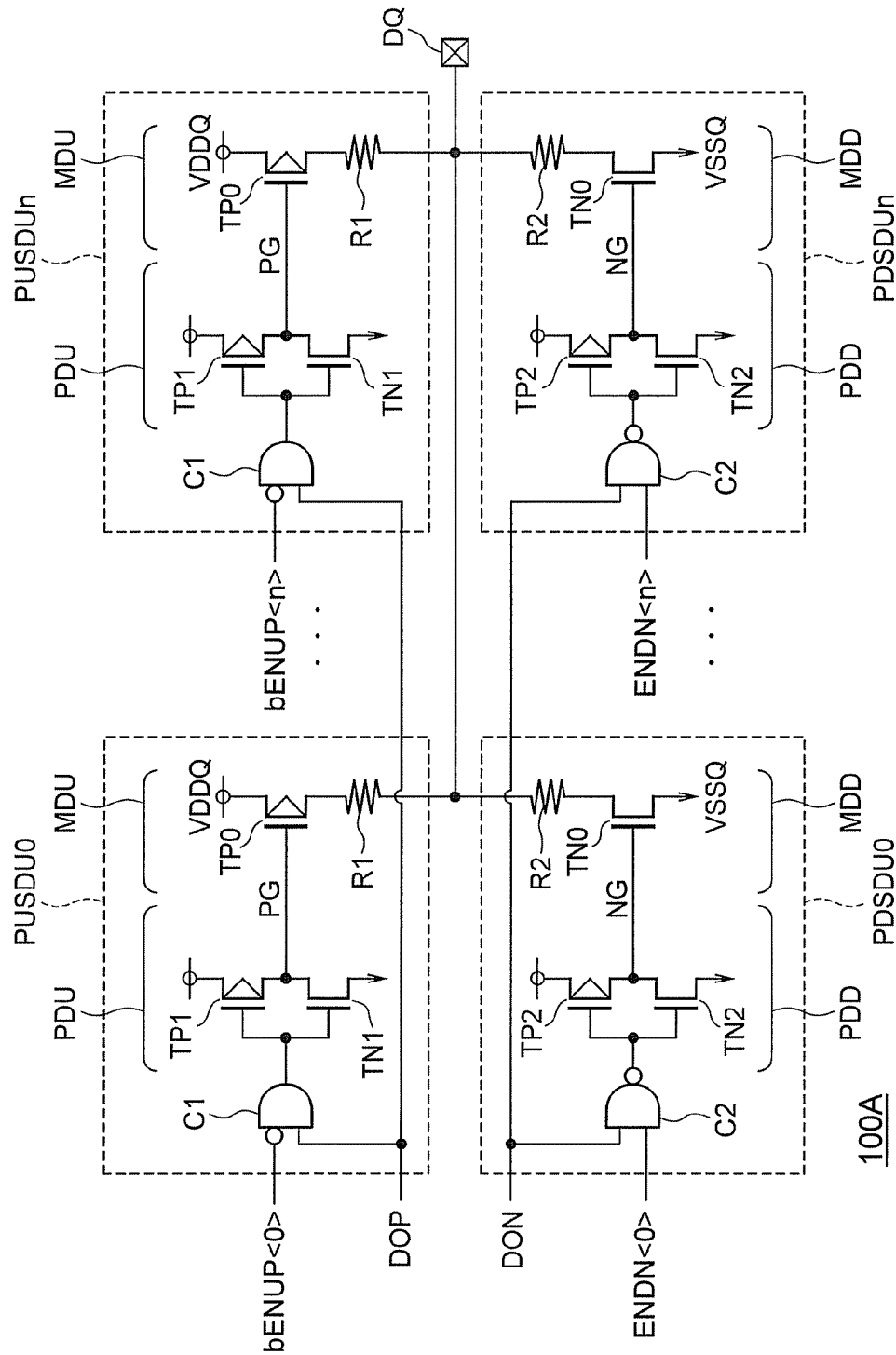
FIG. 1 is a diagram showing a configuration of an output driver circuit according to a comparative example.

FIG. 1 is a diagram showing a configuration of an output driver circuit according to a comparative example.

As shown in FIG. 1, an output driver circuit 100A includes n+1 pull-up sub-drivers PUSDU0, PUSDU1, . . . and PUSDUn, and n+1 pull-down sub-drivers PDSDU0, PDSDU1, . . . and PDSDUn.

A pull-up signal DOP is switched according to output data of a memory core. More specifically, the pull-up signal DOP is at a "High" level when the output data is at a "High" level and is at a "Low" level when the output data is at a "Low" level or when any output operation of a memory does not occur.

The pull-up signal DOP is input to each of the pull-up sub-drivers PUSDU0, PUSDU1, . . . and PUSDUn.

Therefore, in any of the pull-up sub-drivers PUSDU0 to PUSDUn that is selected by a pull-up calibration signal (calibration bit signal) bENUP<n:0>, an nMOS transistor TN1 in a pre-driver PDU is turned on when a data signal at the "High" level is output at a data output terminal DQ. As a result, a gate node PG of a pMOS transistor TP0 is discharged to the "Low" level. The "pull-up calibration signal bENUP<n:0>" represents n+1 (n+1 bits of) pull-up calibration signals bENUP<0>, bENUP<1>, . . . bENUP<n>.

As a result, the pMOS transistor TP0 in a main driver MDU drives the output terminal DQ to the "High" level.

A pull-down signal DON is also switched according to the output data of the memory core. However, the pull-down signal DON is at the "High" level when the output data is at the "Low" level and is at the "Low" level when the output data of the memory core is at the "High" level or when any output operation of the memory does not occur.

The pull-down signal DON is input to each of the pull-down sub-drivers PDSDU0, PDSDU1, . . . PDSDUn.

Therefore, in any of the pull-down sub-drivers PDSDU0 to PDSDUn that is selected by a pull-down calibration signal ENDN<n:0>, a gate node NG of an nMOS transistor TN0 is charged to the "High" level by a pMOS transistor TP2 in a pre-driver PDD when a data signal at the "Low" level is output at the data output terminal DQ. The "pull-down calibration signal ENDN<n:0>" represents n+1 (n+1 bits of) pull-down calibration signals ENDN<0>, ENDN<1>, . . . ENDN<n>.

As a result, the nMOS transistor TN0 in the main driver drives the data output terminal DQ to the "Low" level.

Figure 2A:
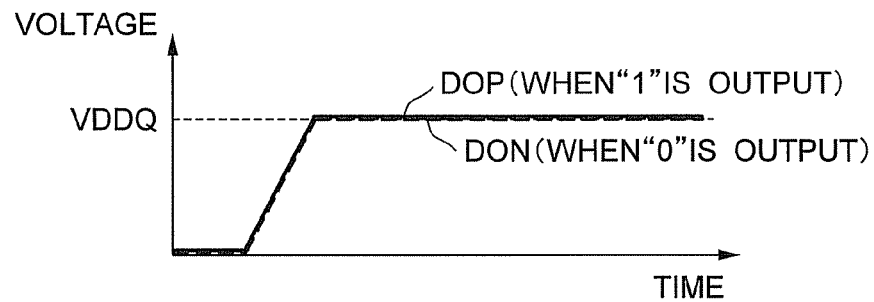
FIG. 2(A) is a waveform diagram showing the pull-up signal DOP at the time when the output data is "1" and the pull-down signal DON at the time when the output data is "0"
Figure 2B:
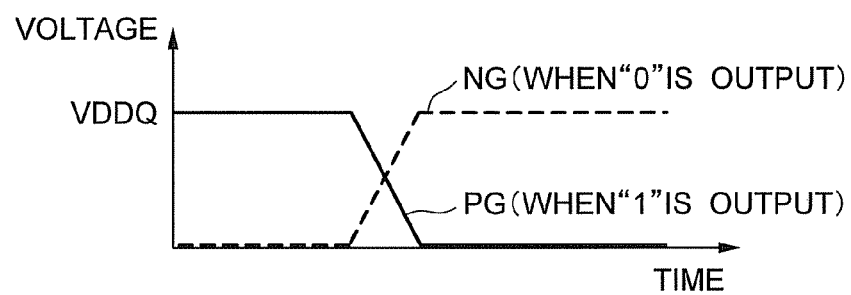
FIG. 2(B) is a waveform diagram showing the voltage at the gate node PG at the time when the output data is "1" and the voltage at the gate node NG at the time when the output data is "0" in the case where the magnitude of the driving current of the nMOS transistor TN1 with respect to the capacitance of the gate node PG of the pMOS transistor TP0 and the magnitude of the driving current of the pMOS transistor TP2 with respect to the capacitance of the gate node NG of the nMOS transistor TN0 are relatively equal to each other.
Figure 2C:
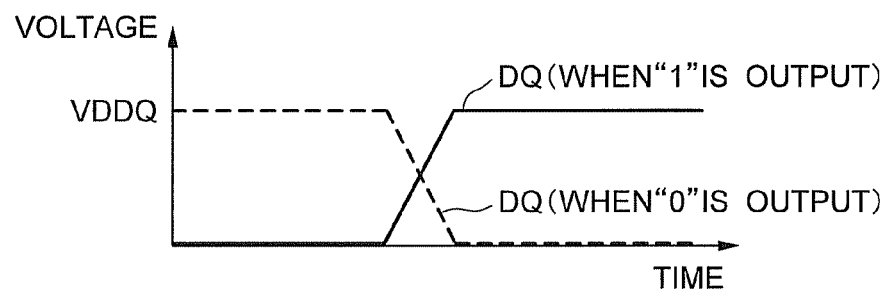
FIG. 2(C) is a waveform diagram showing the voltages at the data output terminal DQ at the times when the output data is "1" and when the output data is "0" in the same case as in FIG. 2(B)

FIG. 2(A) is a waveform diagram showing the pull-up signal DOP at the time when the output data is "1" and the pull-down signal DON at the time when the output data is "0". FIG. 2(B) is a waveform diagram showing the voltage at the gate node PG at the time when the output data is "1" and the voltage at the gate node NG at the time when the output data is "0" in the case where the magnitude of the driving current of the nMOS transistor TN1 with respect to the capacitance of the gate node PG of the pMOS transistor TP0 and the magnitude of the driving current of the pMOS transistor TP2 with respect to the capacitance of the gate node NG of the nMOS transistor TN0 are relatively equal to each other. FIG. 2(C) is a waveform diagram showing the voltages at the data output terminal DQ at the times when the output data is "1" and when the output data is "0" in the same case as in FIG. 2(B).

As shown in FIG. 2, in the case where the magnitude of the driving current of the nMOS transistor TN1 with respect to the capacitance of the gate node PG and the magnitude of the driving current of the pMOS transistor TP2 with respect to the capacitance of the gate node NG are relatively equal to each other, the rate of discharging at the gate node PG and the rate of charging at the gate node NG are equal to each other. As a result, the slew rate of the output voltage (output data signal) at the terminal DQ is stable regardless of the output data.

Figure 3A:
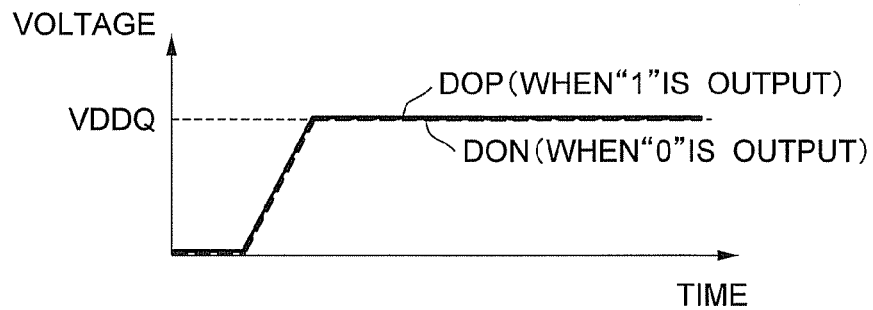
FIG. 3(A) is a waveform diagram showing the pull-up signal DOP at the time when the output data is "1" and the pull-down signal DON at the time when the output data is "0"
Figure 3B:
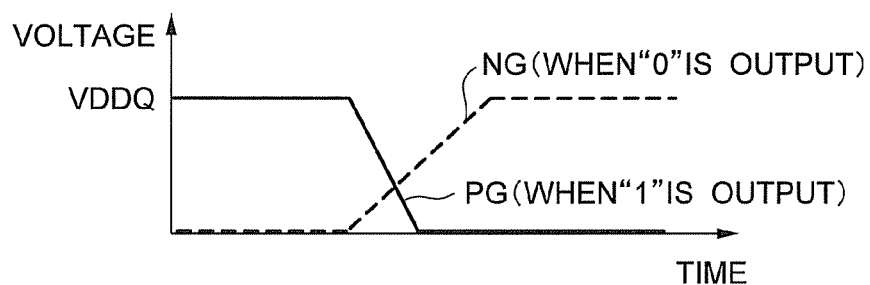
FIG. 3(B) is a waveform diagram showing the voltage at the gate node PG at the time when the output data is "1" and the voltage at the gate node NG at the time when the output data is "0" in the case where the magnitude of the driving current of the pMOS transistor TP2 with respect to the capacitance of the gate node NG is relatively smaller than the magnitude of the driving current of the nMOS transistor TN1 with respect to the capacitance of the gate node PG.
Figure 3C:
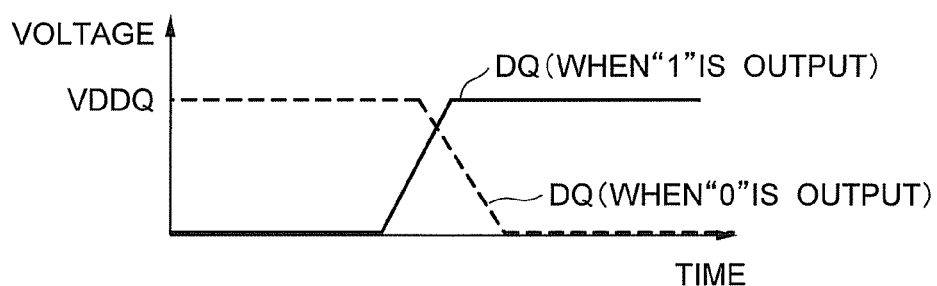
FIG. 3(C) is a waveform diagram showing the voltages at the data output terminal DQ at the times when the output data is "1" and when the output data is "0" in the same case as in FIG. 3(B)

FIG. 3(A) is a waveform diagram showing the pull-up signal DOP at the time when the output data is "1" and the pull-down signal DON at the time when the output data is "0". FIG. 3(B) is a waveform diagram showing the voltage at the gate node PG at the time when the output data is "1" and the voltage at the gate node NG at the time when the output data is "0" in the case where the magnitude of the driving current of the pMOS transistor TP2 with respect to the capacitance of the gate node NG is relatively smaller than the magnitude of the driving current of the nMOS transistor TN1 with respect to the capacitance of the gate node PG. FIG. 3(C) is a waveform diagram showing the voltages at the data output terminal DQ at the times when the output data is "1" and when the output data is "0" in the same case as in FIG. 3(B).

As shown in FIG. 3, in the case where the magnitude of the driving current of the pMOS transistor TP2 with respect to the capacitance of the gate node NG is relatively smaller than the magnitude of the driving current of the nMOS transistor TN1 with respect to the capacitance of the gate node PG, the rate of charging at the gate node NG is lower than the rate of discharging at the gate node PG. As a result, the output of the data of the logic "0" ("Low" level) is delayed. That is, the slew rate of the output voltage at the terminal DQ is unstable.

Figure 4A:
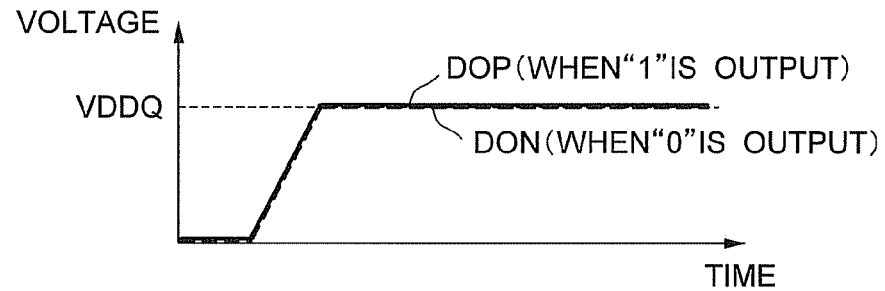
FIG. 4(A) is a waveform diagram showing the pull-up signal DOP at the time when the output data is "1" and the pull-down signal DON at the time when the output data is "0"
Figure 4B:
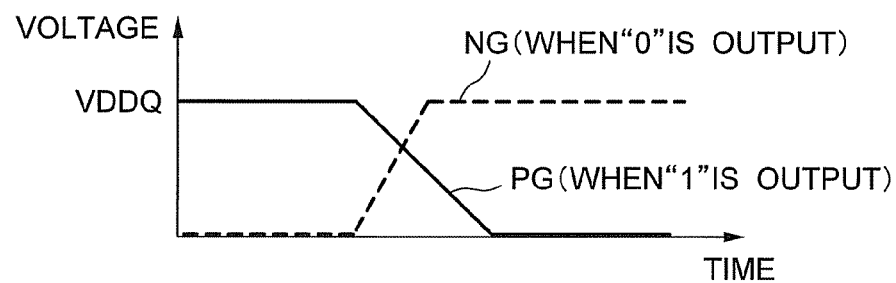
FIG. 4(B) is a waveform diagram showing the voltage at the gate node PG at the time when the output data is "1" and the voltage at the gate node NG at the time when the output data is "0" in the case where the magnitude of the driving current of the nMOS transistor TN1 with respect to the capacitance of the gate node PG is relatively smaller than the magnitude of the driving current of the pMOS transistor TP2 with respect to the capacitance of the gate node NG.
Figure 4C:
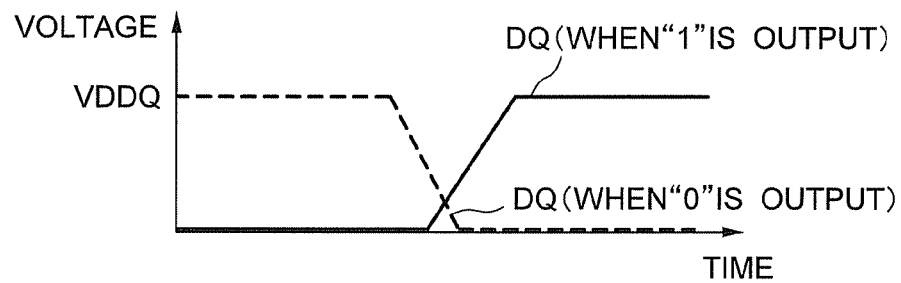
FIG. 4(C) is a waveform diagram showing the voltages at the data output terminal DQ at the times when the output data is "1" and when the output data is "0" in the same case as in FIG. 4(B)

FIG. 4(A) is a waveform diagram showing the pull-up signal DOP at the time when the output data is "1" and the pull-down signal DON at the time when the output data is "0". FIG. 4(B) is a waveform diagram showing the voltage at the gate node PG at the time when the output data is "1" and the voltage at the gate node NG at the time when the output data is "0" in the case where the magnitude of the driving current of the nMOS transistor TN1 with respect to the capacitance of the gate node PG is relatively smaller than the magnitude of the driving current of the pMOS transistor TP2 with respect to the capacitance of the gate node NG. FIG. 4(C) is a waveform diagram showing the voltages at the data output terminal DQ at the times when the output data is "1" and when the output data is "0" in the same case as in FIG. 4(B).

As shown in FIG. 4, in the case where the magnitude of the driving current of the nMOS transistor TN1 with respect to the capacitance of the gate node PG is relatively smaller than the magnitude of the driving current of the pMOS transistor TP2 with respect to the capacitance of the gate node NG, the rate of discharging at the gate node PG is lower than the rate of charging at the gate node NG. As a result, the output of the data signal of the logic "1" ("High" level) is delayed. That is, the slew rate of the output data signal, which depends on the output data, is unstable.

As described above, the driving current of the pMOS transistor TP0 in the main driver MDU for pull-up varies with the rate of discharging at the gate node PG and therefore depends on the driving current of the nMOS transistor TN1 in the pre-driver PDU.

That is, the pull-up slew rate of the output data signal also varies with the process, power supply voltage, temperature and other characteristics of the nMOS transistor TN1.

Besides, the driving current of the nMOS transistor TN0 in a main driver MDD for pull-down varies with the rate of charging at the gate node NG and therefore depends on the driving current of the pMOS transistor TP2 in the pre-driver PDD.

That is, the pull-down slew rate of the output data signal also varies with the process, power supply voltage, temperature and other characteristics of the pMOS transistor TP2.

For the reasons described above, even if the current drivabilities of the pull-up driver and the pull-down driver are equally adjusted by calibration, the mismatch between the pull-up and pull-down slew rates increases with the variations of the characteristics of the transistors forming the pre-drivers.

As a result, the effective time of the output data signal may decrease, and the quality of the waveform may deteriorate.

In view of such circumstances, output driver circuits that maintain a stable slew rate and achieve a high output waveform quality even if the process, power supply voltage or temperature varies are provided in embodiments described below.

In the following, the embodiments will be described with reference to the drawings.

(First Embodiment)

Figure 5:
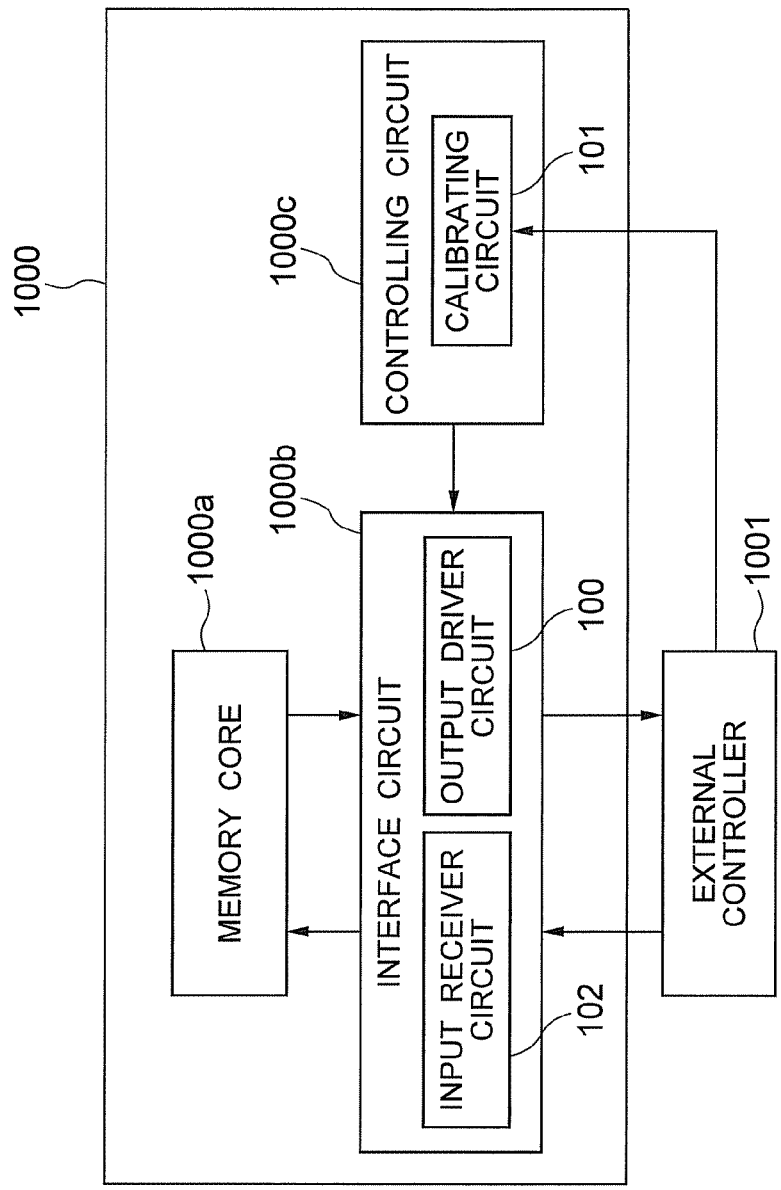
FIG. 5 is a diagram showing an example of a configuration of a semiconductor memory device 1000.

FIG. 5 is a diagram showing an example of a configuration of a semiconductor memory device 1000.

As shown in FIG. 5, the semiconductor memory device 1000 includes a memory core 1000a, an interface circuit 1000b and a controlling circuit 1000c.

The memory core 1000a is configured to store data.

In the interface circuit 1000b, a signal such as input data is input to an input receiver circuit 102 from an external controller 1001, which is located outside the semiconductor memory device 1000, and the input receiver circuit 102 is configured to transfer a signal responsive to the signal to the memory core 1000*a*.

In addition, in the interface circuit 1000*b*, output data read (output) from the memory core 1000*a* is transferred to an output driver circuit 100, and the output driver circuit 100 is configured to output a data signal responsive to the output data to the external controller 1001 from an output terminal DQ.

The controlling circuit 1000*c* is configured to control the output driver circuit 100 and the input receiver circuit 102 according to a control signal input from the external controller 1001. The controlling circuit 1000*c* has a calibrating circuit 101 that calibrates the current drivability of the output driver circuit 100. The calibrating circuit 101 and the output driver circuit 100 form an output driver system capable of calibrating the current drivability thereof.

The semiconductor memory device 1000 is a DRAM, a flash memory or an MRAM, for example.

Figure 6:
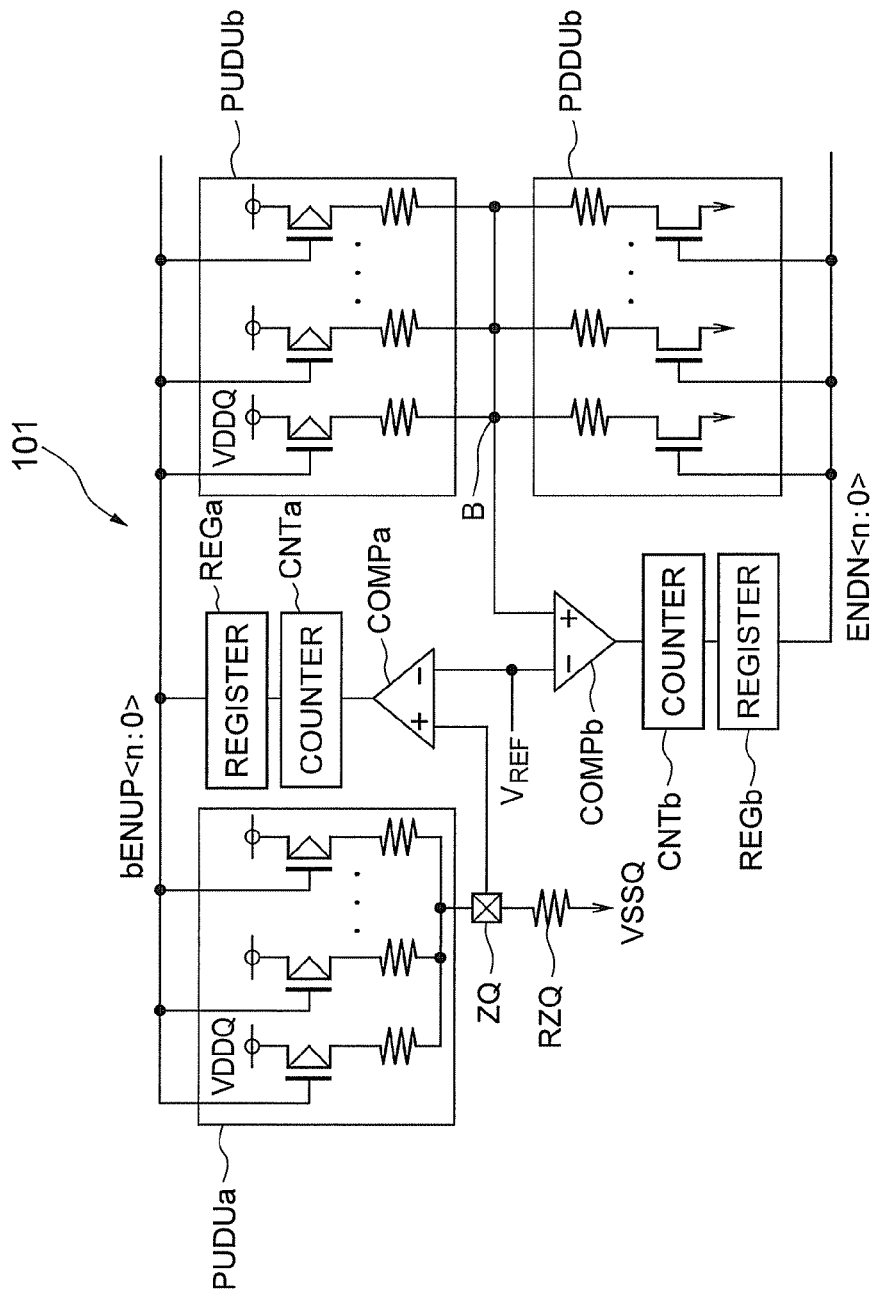
FIG. 6 is a diagram showing an example of a configuration of the calibrating circuit 101 shown in FIG. 5.
Figure 7:
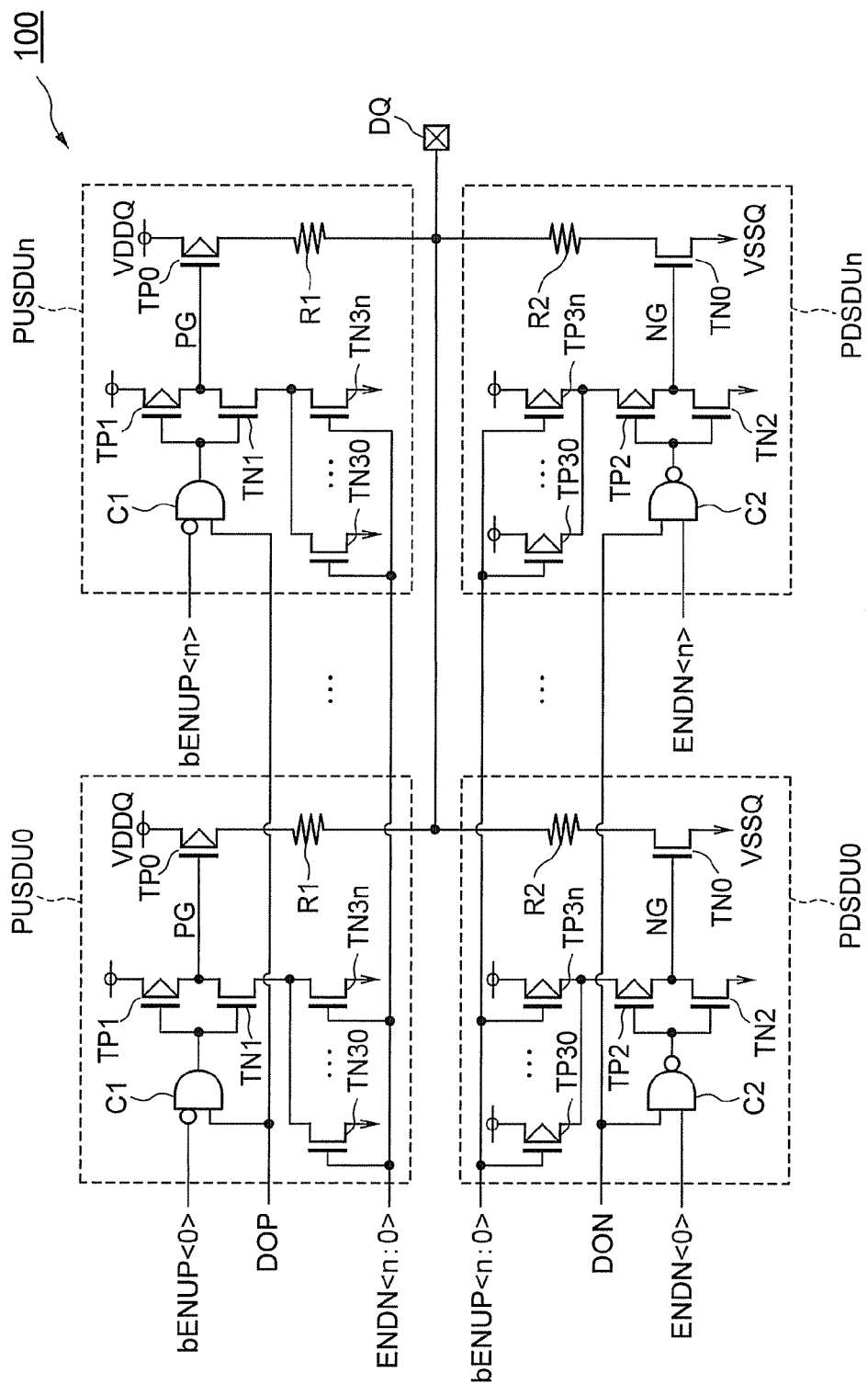
FIG. 7 is a diagram showing an example of a configuration of the output driver circuit 100 shown in FIG. 5.

FIG. 6 is a diagram showing an example of a configuration of the calibrating circuit 101 shown in FIG. 5. FIG. 7 is a diagram showing an example of a configuration of the output driver circuit 100 shown in FIG. 5.

As shown in FIG. 6, the calibrating circuit 101 includes registers REGa and REGb, counters CNTa and CNTb, comparators COMPa and COMPb, pull-up drivers PUDUa and PUDUb, a pull-down driver PDDUb, and a calibrating pad ZQ to which an external reference resistor RZQ is connected. The calibrating circuit 101 performs calibration of the output driver circuit 100 according to the LPDDR2 standard, the DDR3 standard or the like.

Next, an example of the calibration of the output driver circuit 100 configured as described above will be described.

First, among a plurality of pMOS transistors in the pull-up driver PUDUa, a transistor to be activated is determined to pass a current equal to the current flowing through the reference resistor RZQ. Using the counter CNTa, the pMOS transistors are activated one by one in ascending order of the size of the pMOS transistors.

The comparator COMPa detects whether or not the potential at the calibrating pad ZQ is equal to a reference potential "VREF" (typically, VREF=VDDQ n 2), that is, the currents flowing through the reference resistor RZQ and the selected pMOS transistors are equal to each other.

When the potential at the calibrating pad ZQ becomes equal to the reference potential "VREF", the comparator COMPa instructs the counter CNTa to stop counting up. In this way, a pull-up calibration signal bENUP<n:0> to select the pMOS transistors to be activated is determined.

The pull-up calibration signal bENUP<n:0> is a so-called low active signal. That is, the pull-up calibration signal bENUP<n:0> turns on the pMOS transistors when the signal is at the "Low" level.

The determined pull-up calibration signal bENUP<n:0> is retained in the register REGa and provided to the pull-up driver PUDUb, which has a configuration similar to the pull-up driver PUDUa.

Then, among a plurality of nMOS transistors in the pull-down driver PDDUb, some transistors to be activated are determined to pass a current equal to the current flowing through the pull-up driver PUDUb.

Using the counter CNTb, the nMOS transistors are activated one by one in ascending order of the size of the nMOS transistors.

The comparator COMPb detects the point in time when the potential at a node B is equal to the reference potential "VREF", that is, the current which the pull-up driver PUDUb passes and the current which the nMOS transistors in the pull-down driver PDDUb passes are equal to each other.

When the potential at the node B becomes equal to the reference potential "VREF", the comparator COMPb instructs the counter CNTb to stop counting up. In this way, a pull-down calibration signal ENDN<n:0> to select the nMOS transistors to be activated is determined.

The pull-down calibration signal ENDN<n:0> is a so-called high active signal. That is, the pull-down calibration signal ENDN<n:0> turns on the nMOS transistors when the signal is at the "High" level.

The determined pull-down calibration signal ENDN<n:0> is retained in the register REGb.

As described later, the output driver circuit 100 includes a plurality of pull-up drivers PUDU0 to PUDUn having a configuration similar to those of the pull-up drivers PUDUa and PUDUb in the calibrating circuit 101.

The pull-up calibration signal bENUP<n:0> determined by calibration is provided to each pull-up driver PUDU.

The output driver circuit 100 further includes a plurality of pull-down drivers PDDU having a configuration similar to that of the pull-down driver PDDUb.

The pull-down calibration signal ENDN<n:0> determined by calibration is provided to each pull-down driver PDDU.

Thus, the output driver circuit 100 uses a set of the same number of pull-up drivers and pull-down drivers adjusted to have the same on-resistance as the reference resistor RZQ.

That is, selection from among pull-up sub-drivers PUSDU0 to PUSDUn and selection from among pull-down sub-drivers PDSDU0 to PDSDUn are made by the assigned pull-up calibration signal bENUP<n:0> and the assigned pull-down calibration signal ENDN<n:0>, respectively, so as to make the pull-up driving current drivability and the pull-down current drivability for the voltage at the output terminal DQ equal to each other.

As a result, data can be output with a plurality of levels keeping equal pull-up and pull-down current drivabilities.

A pull-down signal DON is switched according to the output data. The pull-down signal DON is at the "High" level when the output data is at the "Low" level and is at the "Low" level when the output data is at the "High" level or any output operation of the memory does not occur.

As described above, the result of the calibration is reflected in the output driver circuit 100.

The output driver circuit 100 shown in FIG. 7 outputs from the output terminal DQ a data signal responsive to the output data read from the memory core 1000*a*.

As shown in FIG. 7, the output driver circuit 100 includes a plurality of (n+1) pull-up sub-drivers PUSDU0 to PUSDUn and a plurality of (n+1) pull-down sub-drivers PDSDU0 to PDSDUn.

The plurality of (n+1, where n≥1) pull-up sub-drivers PUSDU0 to PUSDUn are configured to pull up the voltage at the output terminal DQ according to a pull-up signal DOP based on the output data.

For example, the pull-up sub-driver PUSDU0 includes a first logic circuit C1, a first sub pMOS transistor TP1, a first sub nMOS transistor TN1, a plurality of (n+1) first calibrating nMOS transistors TN30 to TN3n, a first main pMOS transistor TP0 and a first main resistor R1.

To the first logic circuit C1, the assigned pull-up calibration signal bENUP<0> and the pull-up signal DOP are input. The first logic circuit C1 is an AND circuit to which the assigned pull-up calibration signal bENUP<0> inverted and the pull-up signal DOP are input and which is connected to the gate of the first sub pMOS transistor TP1 at an output thereof, for example.

The first sub pMOS transistor TP1 is connected to a power supply (first power supply line) VDDQ at one end (source) thereof and to the output of the first logic circuit C1 at the gate thereof.

The first sub nMOS transistor TN1 is connected to another end (drain) of the first sub pMOS transistor TP1 at one end (drain) thereof and to the output of the first logic circuit C1 at the gate thereof.

The plurality of (n+1) first calibrating nMOS transistors TN30 to TN3n are connected between another end (source) of the first sub nMOS transistor TN1 and a ground (second power supply line) VSSQ, and each of the plurality of (n+1) assigned pull-down calibration signals ENDN<n:0> is input to the gate of the corresponding one of the first calibrating nMOS transistors. For example, the pull-down calibration signal ENDN<0> is input to the first calibrating nMOS transistor TN30, and the pull-down calibration signal ENDN<n> is input to the first calibrating nMOS transistor TN3n.

The first main pMOS transistor TP0 is connected to the power supply VDDQ at one end thereof and to another end of the first sub pMOS transistor at the gate thereof.

The first main resistor R1 is connected between another end (drain) of the first main pMOS transistor TP0 and the output terminal DQ. Although the main pMOS transistor is connected to the output terminal DQ via a resistive element in this example, the main pMOS transistor may be directly connected to the output terminal or connected to the output terminal via another element.

The remaining pull-up sub-drivers PUSDU1 to PUSDUn have a similar circuit configuration and receive the respective assigned pull-up calibration signal bENUP<n:1>.

As described above, the first calibrating nMOS transistors TN30 to TN3n are connected in parallel between the source of the first sub nMOS transistor TN1 in each of the pull-up sub-drivers PUSDU0 to PUSDUn and the ground (second power supply line) VSSQ (for convenience, the first calibrating nMOS transistors TN30 to TN3n may sometimes be collectively referred to as one first calibrating nMOS transistor TN3 hereinafter). The assigned pull-down calibration signal ENDN<n:0> is input to the gate of each of the first calibrating nMOS transistors TN30 to TN3n.

For example, the pull-down calibration signal ENDN<0> is input to the gate of the nMOS transistor TN30.

The first calibrating nMOS transistor TN3 has a configuration similar to that of the nMOS transistors in the pull-down drivers of the calibrating circuit 101.

Since the required sizes of a first main nMOS transistor TN0 and the first calibrating nMOS transistor TN3 differ from each other, these transistors, of course, have different transistor sizes (gate widths). However, these transistors have to have an equal ratio between the sizes for the respective bits.

In addition, these transistors desirably have equal gate lengths or other parameters that have a great effect on the characteristics of the transistors.

In addition, as a default setting in the design phase, the sizes of these transistors have to be determined to select the same bit.

With the configuration described above, even if the nMOS transistors have variable characteristics, the size of the nMOS transistor TN3 in the pre-driver can be adjusted by reflecting the result of calibration. As a result, the rate of discharging at a gate node PG of the first main pMOS transistor TP0 is constant, and variations of the pull-up slew rate of the output data can be reduced.

The rate of discharging at the gate node PG is designed to be substantially determined by the on-resistance of the nMOS transistor TN3. This makes the effect of variations of the nMOS transistor TN1 on the rate of discharging at the gate node PG negligible.

As described above, the timings of turning on of the pull-up sub-drivers PUSDU0 to PUSDUn are calibrated by the pull-down calibration signal ENDN<n:0>.

On the other hand, the plurality of (n+1) pull-down sub-drivers PDSDU0 to PDSDUn are configured to pull down the voltage at the output terminal DQ according to the pull-down signal DON based on the output data.

For example, the pull-down sub-driver PDSDU0 includes a second logic circuit C2, a second sub pMOS transistor TP2, a second sub nMOS transistor TN2, a plurality of (n+1) first calibrating pMOS transistors TP30 to TP3n, a first main nMOS transistor TN0 and a second main resistor R2.

To the second logic circuit C2, the assigned pull-down calibration signal ENDN<0> and the pull-down signal DON are input. The second logic circuit C2 is a NAND circuit to which the assigned pull-down calibration signal ENDN<0> and the pull-down signal DON are input and which is connected to the gate of the second sub nMOS transistor TN2 at an output thereof, for example.

The second sub nMOS transistor TN2 is connected to the ground (second power supply line) VSSQ at one end (source) thereof and to the output of the second logic circuit C2 at the gate thereof.

The second sub pMOS transistor TP2 is connected to another end (drain) of the second sub nMOS transistor TN2 at one end (drain) thereof and to the output of the second logic circuit C2 at the gate thereof.

The plurality of (n+1) first calibrating pMOS transistors TP30 to TP3n are connected between another end (source) of the second sub pMOS transistor TP2 and the power supply VDDQ, and the assigned pull-up calibration signal bENUP<n:0> is input to the gate of each first calibrating pMOS transistor. For example, the pull-up calibration signal bENUP<0> is input to the first calibrating pMOS transistor TP30, and the pull-up calibration signal bENUP<n> is input to the first calibrating pMOS transistor TP3n.

The first main nMOS transistor TN0 is connected to the ground VSSQ at one end (source) thereof and to another end (drain) of the second sub nMOS transistor TN2 at the gate thereof.

The second main resistor R2 is connected between another end (drain) of the second main nMOS transistor TN0 and the output terminal DQ. Although the main nMOS transistor is connected to the output terminal DQ via a resistive element in this example, the main nMOS transistor may be directly connected to the output terminal or connected to the output terminal via another element.

The remaining pull-down sub-drivers PDSDU1 to PDSDUn have a similar circuit configuration and receive the respective assigned pull-down calibration signal ENDN<n:1>.

As described above, the first calibrating pMOS transistors TP30 to TP3n are connected in parallel between the source of the pMOS transistor TP2 in the pull-down sub-drivers PDSDU0 to PDSDUn and the power supply VDDQ (for convenience, the first calibrating pMOS transistors TP30 to TP3n may sometimes be collectively referred to as one first calibrating pMOS transistor TP3 hereinafter). The assigned pull-up calibration signal bENUP<n:0> is input to the gate of each of the first calibrating pMOS transistors TP30 to TP3n.

For example, the pull-up calibration signal bENUP<0> is input to the gate of the pMOS transistor TP30.

The first calibrating pMOS transistor TP3 has a configuration similar to that of the pMOS transistors in the pull-up drivers of the calibrating circuit 101.

Since the required sizes of the first main pMOS transistor TP0 and the first calibrating pMOS transistor TP3 differ from each other, these transistors have different transistor sizes (gate widths). However, these transistors have to have an equal ratio between the sizes for the respective bits.

In addition, these transistors desirably have equal gate lengths or other parameters that have a great effect on the characteristics of the transistors.

In addition, as a default setting in the design phase, the sizes of these transistors have to be determined to select the same bit.

With the configuration described above, even if the pMOS transistors have variable characteristics, the size of the pMOS transistor TP3 in the pre-driver can be adjusted by reflecting the result of calibration. As a result, the rate of charging at a gate node NG is constant, and variations of the pull-down slew rate of the output data can be reduced.

The rate of charging at the gate node NG is designed to be substantially determined by the on-resistance of the pMOS transistor TP3. This makes the effect of variations of the pMOS transistor TP2 on the rate of charging at the gate terminal NG negligible.

As described above, the timings of turning on of the pull-down sub-drivers PDSDU0 to PDSDUn are calibrated by the pull-up calibration signal bENUP<n:0>.

That is, not only the main transistor in the output driver circuit 100 but also the transistors in the pre-driver that drives the gate of the main transistor can be adjusted using the calibration signal for adjusting the current drivability of the main driver.

As a result, variations of the slew rate of the output data caused by variations of the characteristics of the pre-drivers can be reduced. That is, deterioration of the quality of the output waveform of the output driver circuit 100 can be reduced.

As described above, the output driver circuit according to the first embodiment can be improved in quality of the output waveform while remaining the slew rate.

(Second Embodiment)

The above description of the first embodiment has been focused on variations of the slew rate of the output data caused by variations of the characteristics of the pre-drivers.

However, the quality of the output waveform is also affected by variations of the speed of turning off the main drivers in the on state in transition of the output data.

If the timing of turning off of a main driver in the on state is delayed, when a main driver in the off state is turned on, both the main drivers are temporarily in the on state, and a through-current flows from the power supply (first power supply line) VDDQ to the ground (second power supply line) VSSQ, so that a proper output waveform cannot be obtained.

On the other hand, if the timing of turning off of a main driver in the on state is advanced, when a main driver in the off state is turned on, both the main drivers are temporarily in the off state, and the value of di/dt increases, so that the output waveform can be distorted because of a parasitic inductance on the transmission line.

In addition, for a interface termination, the output can be pulled to the terminal potential, and the quality of the output waveform can deteriorate.

Therefore, the speed of turning off the main drivers in the on state is desirably stable even if there are variations of the characteristics of the pre-drivers.

Thus, in a second embodiment, an example of a configuration of another output driver circuit will be described. As with the output driver circuit 100 shown in FIG. 7, an output driver circuit 200 according to the second embodiment is used in the semiconductor memory device 1000 shown in FIG. 5.

Figure 8:
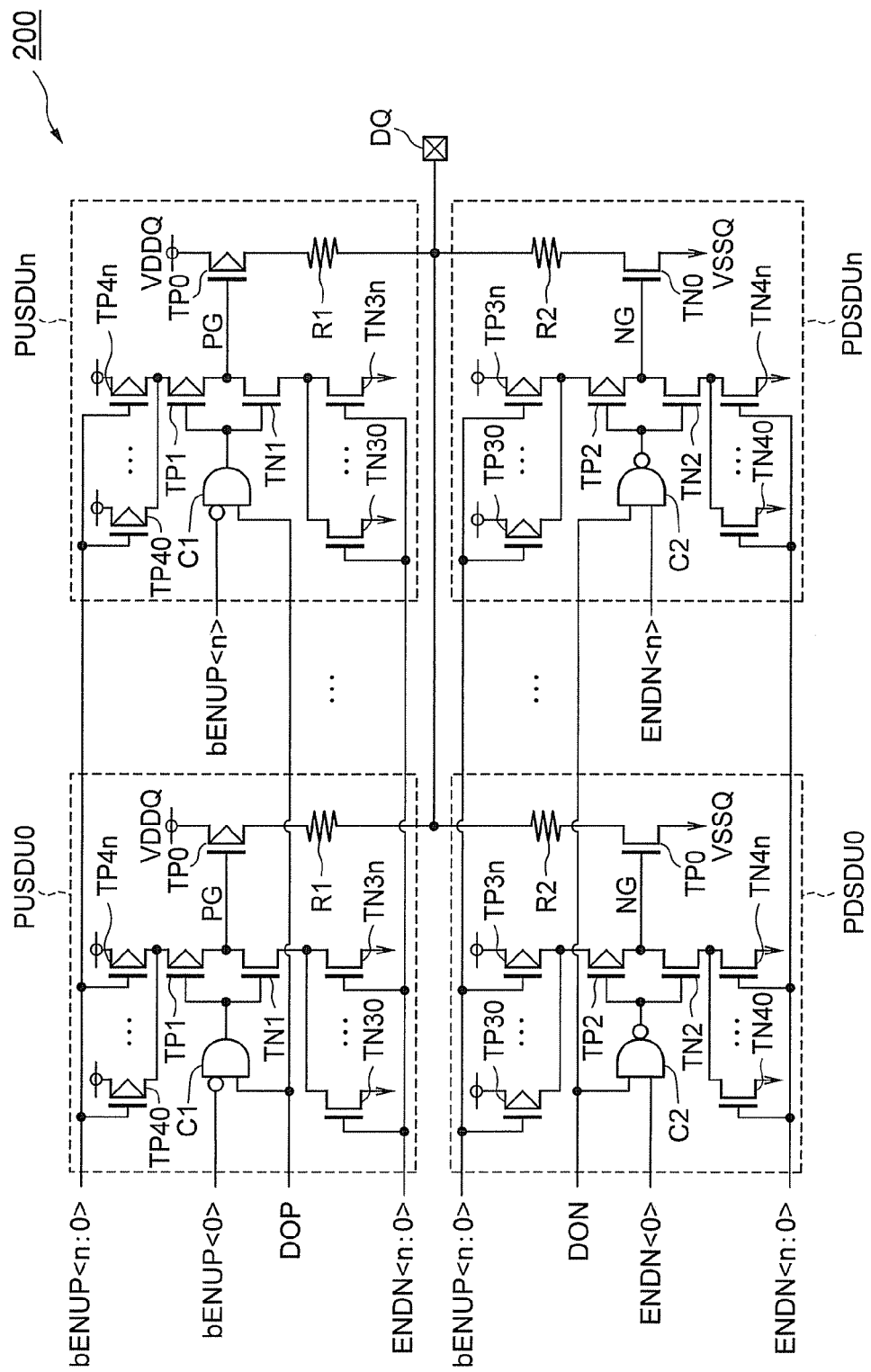
FIG. 8 is a diagram showing an example of a configuration of the output driver circuit 200.

FIG. 8 is a diagram showing an example of a configuration of the output driver circuit 200. In FIG. 8, the same reference numerals as those in FIG. 7 denote the same components as those in the first embodiment.

As shown in FIG. 8, the output driver circuit 200 according to the second embodiment differs from the output driver circuit 100 according to the first embodiment in the configurations of the pull-up sub-drivers PUSDU0 to PUSDUn and the pull-down sub-drivers PDSDU0 to PDSDUn.

More specifically, the pull-up sub-drivers PUSDU0 to PUSDUn further include a plurality of (n+1) second calibrating pMOS transistors TP40 to TP4n that are connected between the power supply (first power supply line) VDDQ and one end (source) of the first sub pMOS transistor TP1 and to the gate of each of which the assigned pull-up calibration signal bENUP<n:0> is input.

The pull-down sub-drivers PDSDU0 to PDSDUn further include a plurality of (n+1) second calibrating nMOS transistors TN40 to TN4n that are connected between the ground (second power supply line) VSSQ and one end (source) of the second sub nMOS transistor TN2 and to the gate of each of which the assigned pull-down calibration signal ENDN<n:0> is input.

As described above, the second calibrating pMOS transistors TP40 to TP4n are connected in parallel between the source of the pMOS transistor TP2 of each of the pull-up sub-drivers and the power supply VDDQ (for convenience, the second calibrating pMOS transistors TP40 to TP4n may sometimes be collectively referred to as one second calibrating pMOS transistor TP4 hereinafter). The pull-up calibration signal bENUP<n:0> is input to the gate of the second calibrating pMOS transistor TP4.

The pMOS transistor TP4 has a configuration similar to that of the pMOS transistors in the pull-up drivers of the calibrating circuit 101.

The required sizes of the pMOS transistors in the pull-up drivers of the calibrating circuit 101 and the pMOS transistor TP4 differ from each other. Therefore, these transistors, of course, have different transistor sizes (gate widths) but have to have an equal ratio between the sizes for the respective bits.

In addition, these transistors desirably have equal gate lengths or other parameters that have a great effect on the characteristics of the transistors.

In addition, as a default setting in the design phase, the sizes of these transistors have to be determined to select the same bit.

With the configuration described above, even if the pMOS transistors have variable characteristics, the size of the pMOS transistor TP4 in the pre-driver can be adjusted by reflecting the result of calibration.

As a result, the rate of charging at the gate node PG of the first main pMOS transistor TP0 is constant, and the timing of turning off of the pMOS transistor TP0 in the main driver in transition of the output data from the "High" level to the "Low" level is constant, so that variations of the output waveform can be reduced.

The rate of charging at the gate node PG is designed to be substantially determined by the on-resistance of the pMOS transistor TP4, so that variations of the pMOS transistor TP1 are negligible.

As described above, the timings of turning off of the pull-up sub-drivers PUSDU0 to PUSDUn are calibrated by the pull-up calibration signal bENUP<n:0>.

On the other hand, the nMOS transistors TN40 to TN4n are connected in parallel between the source of the second calibrating nMOS transistor TN2 of each of the pull-down sub-drivers PDSDU0 to PDSDUn and the ground (second power supply line) VSSQ (for convenience, these nMOS transistors TN40 to TN4n may sometimes be collectively referred to as one second calibrating nMOS transistor TN4 hereinafter). The pull-down calibration signal ENDN<n:0> is input to the gate of the second calibrating nMOS transistor TN4.

The nMOS transistor TN4 has a configuration similar to that of the nMOS transistors in the pull-down drivers of the calibrating circuit 101. However, the required sizes of the nMOS transistors in the pull-up drivers and the nMOS transistor TN4 differ from each other.

Therefore, these transistors, of course, have different transistor sizes (gate widths) but have to have an equal ratio between the sizes for the respective bits.

In addition, these transistors desirably have equal gate lengths or other parameters that have a great effect on the characteristics of the transistors.

In addition, as a default setting in the design phase, the sizes of these transistors have to be determined to select the same bit.

With the configuration described above, even if the nMOS transistors have variable characteristics, the size of the nMOS transistor TN4 in the pre-driver can be adjusted by reflecting the result of calibration.

As a result, the rate of discharging at the gate node NG of the first main nMOS transistor TN0 is constant, and the timing of turning off of the nMOS transistor TN0 in the main driver in transition of the output data from the "Low" level to the "High" level is constant, so that variations of the output waveform can be reduced.

The rate of discharging at the gate node NG is designed to be substantially determined by the on-resistance of the nMOS transistor TN4, so that variations of the nMOS transistor TN2 are negligible.

As described above, the timings of turning off of the pull-down sub-drivers PDSDU0 to PDSDUn are calibrated by the pull-down calibration signal ENDN<n:0>.

As described above, according to this configuration, not only the current drivability of the output main driver but also the current drivability of the transistors in the pre-driver that charges or discharges the gate of the main driver can be adjusted using the calibration signal for adjusting the current drivability of the main driver.

As a result, even in turning off the main driver in the on state, variations of the slew rate of the output data caused by variations of the characteristics of the pre-drivers can be reduced.

As described above, as in the first embodiment, the output driver circuit according to the second embodiment can be improved in quality of the output waveform while maintaining the slew rate.

(Third Embodiment)

In the second embodiment described above, the number of bits of the main nMOS transistors TN0 in the pull-down driver of the calibrating circuit 101 is equal to the number of bits of the nMOS transistor TN3 in the pull-up sub-drivers and the number of bits of the nMOS transistor TN4 in the pull-down sub-drivers.

In the case where the adjustment of the transistors in the pre-driver requires a lower precision than the adjustment of the transistors in the main driver, a configuration that includes only transistors for higher order bits is possible.

In a third embodiment, an example of a configuration of another output driver circuit will be described. As with the output driver circuit 200 shown in FIG. 8, an output driver circuit 300 according to the third embodiment is used in the semiconductor memory device 1000 shown in FIG. 5.

Figure 9:
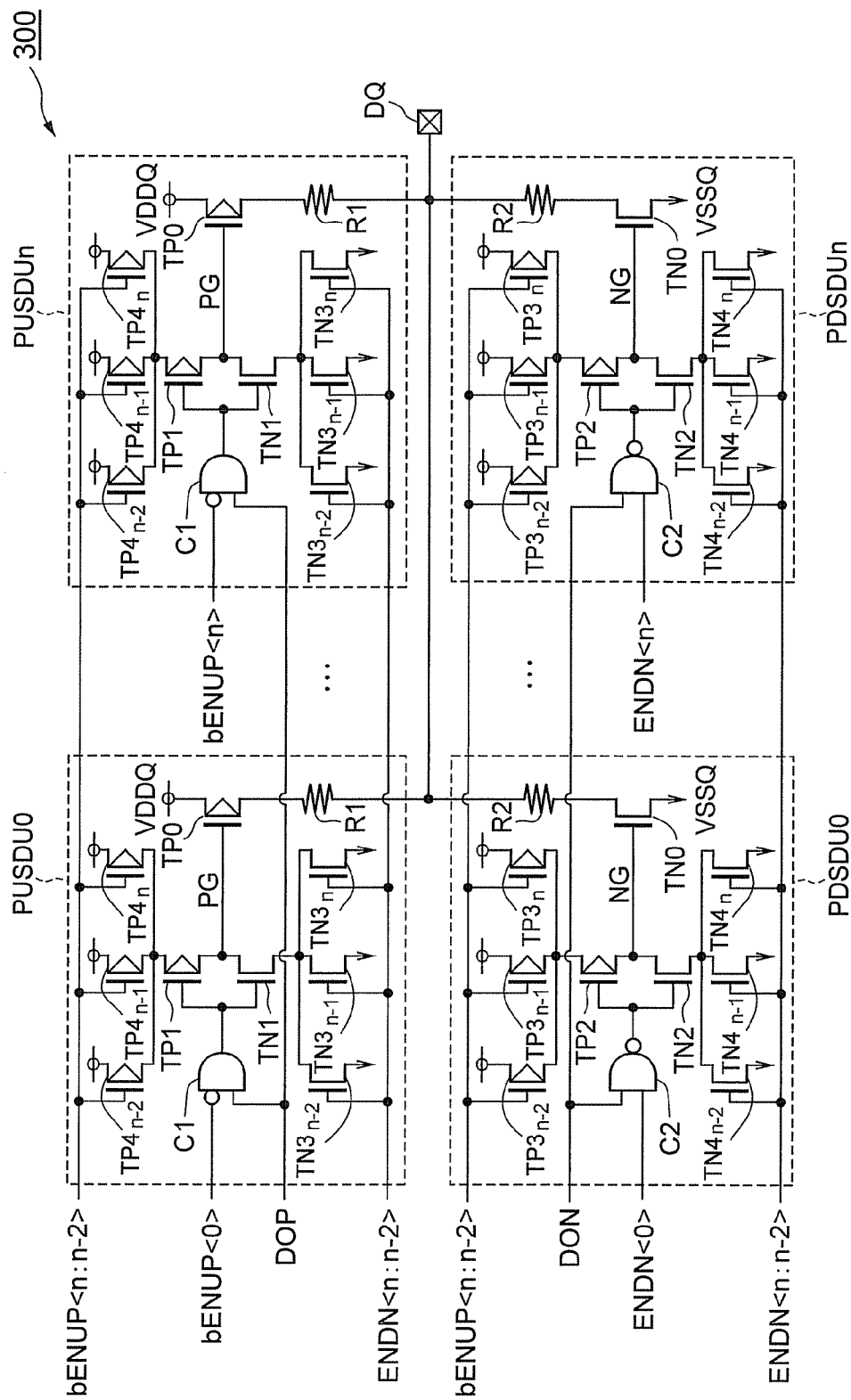
FIG. 9 is a diagram showing an example of the configuration of the output driver circuit 300.

FIG. 9 is a diagram showing an example of the configuration of the output driver circuit 300. In FIG. 9, the same reference numerals as those in FIG. 8 denote the same components as those in the second embodiment.

As described above, the pull-down driver of the calibrating circuit 101 has n+1 bits of nMOS transistors TN0. On the other hand, as shown in FIG. 9, according to the third embodiment, the output driver circuit 300 has only the highest three bits (n to n−2) of first and second calibrating nMOS transistors TN3 and TN4.

The plurality of pull-down sub-drivers PDSDU0 to PDSDUn have different pull-up current drivabilities. That is, the timings of turning on of the pull-up sub-drivers PUSDU0 to PUSDUn and turning off of the pull-down sub-drivers PDSDU0 to PDSDUn are calibrated using only the pull-down calibration signals ENDN<n:n−2> assigned to the pull-down sub-drivers PDSDUn, PDSDUn−1 and PDSDUn−2 having the highest current drivabilities selected from among the plurality of pull-down sub-drivers PDSDU0 to PDSDUn.

Similarly, the pull-up driver of the calibrating circuit 101 has n+1 bits of pMOS transistors TP0. On the other hand, as shown in FIG. 9, according to the third embodiment, the output driver circuit 300 has only the highest three bits (n to n−2) of first and second calibrating pMOS transistors TP3 and TP4.

The plurality of pull-up sub-drivers PUSDU0 to PUSDUn have different pull-down current drivabilities. That is, the timings of turning on of the pull-down sub-drivers PDSDU0 to PDSDUn and turning off of the pull-up sub-drivers PUSDU0 to PUSDUn are calibrated using only the pull-up calibration signals bENUP<n:n−2> assigned to the pull-up sub-drivers PUSDUn, PUSDUn−1 and PUSDUn−2 having the highest current drivabilites selected from among the plurality of pull-up sub-drivers PUSDU0 to PUSDUn.

Although the number of bits for adjustment of the calibrating nMOS transistors and the number of bits for adjustment of the calibrating pMOS transistors are equal to each other in this example, the numbers do not have to be equal to each other.

As described above, compared with the number of bits for adjustment of the transistors in the calibrating circuit 101, the number of bits for adjustment of the transistors in the pre-driver is reduced to reflect only the higher order bits.

As a result, compared with the configuration according to the second embodiment, there is a possibility that the deterioration of the output waveform quality caused by variations of the transistors can be reduced with a smaller number of elements.

As described above, as in the second embodiment, the output driver circuit according to the third embodiment can be improved in quality of the output waveform while maintaining the slew rate.

(Fourth Embodiment)

In a fourth embodiment, an example of a configuration of another output driver circuit will be described. As with the output driver circuit 300 shown in FIG. 9, an output driver circuit 400 according to the fourth embodiment is used in the semiconductor memory device 1000 shown in FIG. 5.

Figure 10:
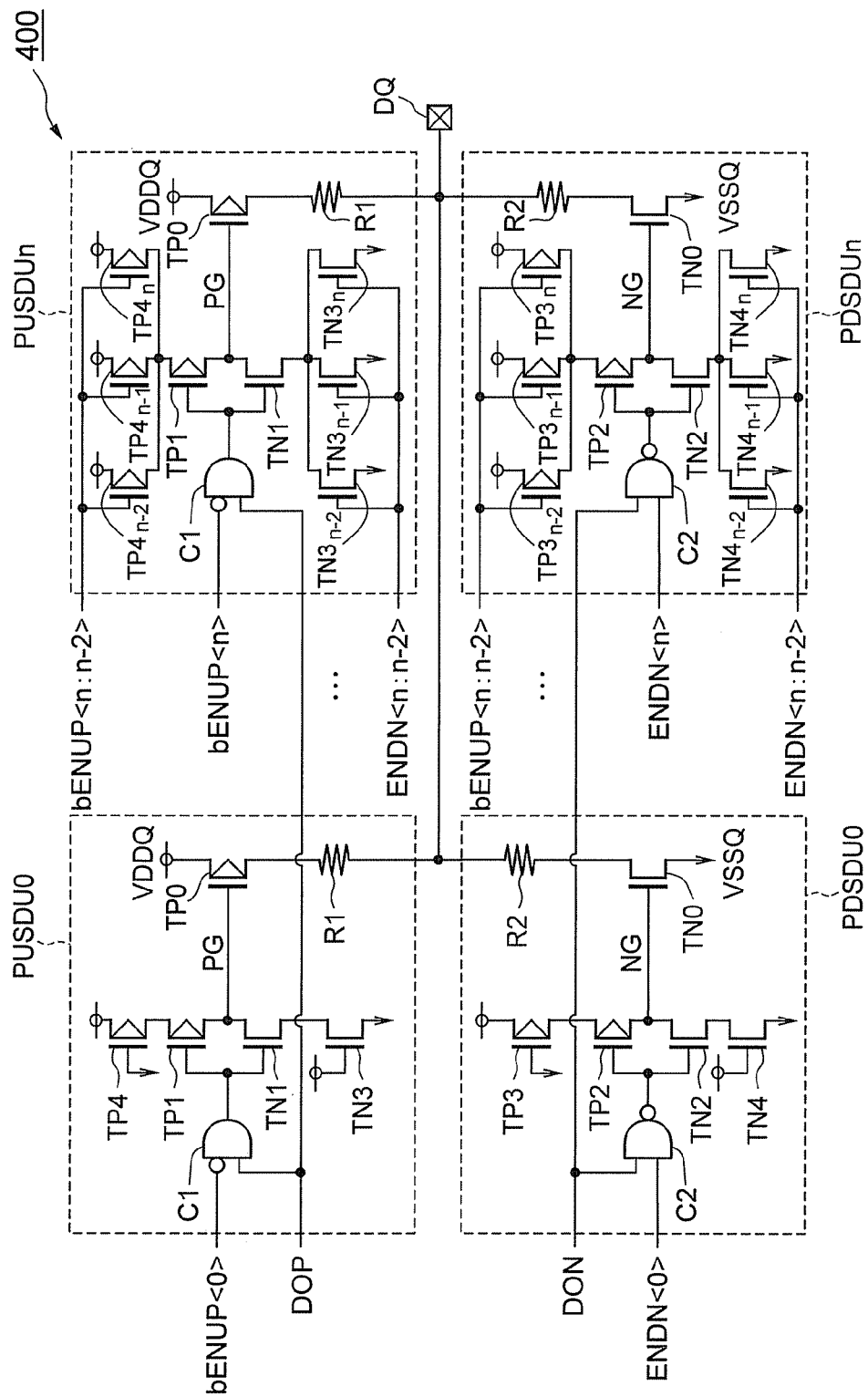
FIG. 10 is a diagram showing an example of the configuration of the output driver circuit 400.

FIG. 10 is a diagram showing an example of the configuration of the output driver circuit 400. In FIG. 10, the same reference numerals as those in FIG. 9 denote the same components as those in the third embodiment.

In the third embodiment described above, the calibrating nMOS transistors TN3 and the calibrating pMOS transistors TP4 in all the pull-up sub-drivers PUSDU0 to PUSDUn have similar configurations.

In addition, the calibrating pMOS transistors TP3 and the calibrating nMOS transistors TN4 in all the pull-down sub-drivers PDSDU0 to PDSDUn have similar configurations.

However, the pMOS transistor TP0 in the main driver of each of the pull-up sub-drivers PUSDU0 to PUSDUn has a different size, and the size increases with the order of the bit. Similarly, the nMOS transistor TN0 in the main driver of each of the pull-down sub-drivers PDSDU has a different size, and the size increases with the order of the bit.

Therefore, the lower the order of the bit for the sub-driver, the smaller the effect of the main driver in the sub-driver on the output data waveform is.

That is, the deterioration of the output waveform caused by variations of the characteristics of the pre-drivers for lower order bits can be neglected to some extent.

Thus, according to the fourth embodiment, only the calibrating nMOS transistors TN3 and TN4 and the calibrating pMOS transistors TP3 and TP4 in the pre-drivers of pull-up sub-drivers and pull-down sub-drivers assigned to higher order bits are adjustable by the calibrating signals, and the transistors in the pre-drivers of pull-up sub-drivers and pull-down sub-drivers assigned to lower order bits have no calibrating signals at their gates.

That is, only in some pull-up sub-drivers having higher current drivabilities of the plurality of pull-up sub-drivers PUSDU0 to PUSDUn, the timing of turning on of the pull-up sub-drivers is calibrated by the pull-down calibration signal ENDN<n:n−2>, and the turning off thereof is calibrated by the pull-up calibration signal bENUP<n:n−2>.

In addition, only in some pull-down sub-drivers having higher current drivabilities of the plurality of pull-down sub-drivers PDSDU0 to PDSDUn, the timing of turning on of the pull-down sub-drivers is calibrated by the pull-up calibration signal bENUP<n:n−2>, and the timing of turning off thereof is calibrated by the pull-down calibration signal ENDN<n:n−2>.

Although only the transistors in the pre-drivers of the pull-up sub-driver PUSDUn and the pull-down sub-driver PDSDUn assigned to the highest order bit are adjustable in this embodiment, to which order bit the transistors are configured to be adjustable is not particularly limited.

As described above, only transistors in the pre-drivers of the sub-drivers assigned to higher order bits are configured to be adjustable by the calibration signals. As a result, there is a possibility that the deterioration of the output waveform quality caused by variations of the transistors can be reduced with an even smaller number of elements than the configuration according to the third embodiment.

As described above, as in the first embodiment, the output driver circuit according to the fourth embodiment can be improved in quality of the output waveform while maintaining the slew rate.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An output driver circuit that outputs, at an output terminal, a data signal responsive to output data read from a memory core, the output driver circuit comprising:
    a plurality of pull-up sub-drivers that pull up a voltage at the output terminal according to a pull-up signal based on the output data; and
    a plurality of pull-down sub-drivers that pull down the voltage at the output terminal according to a pull-down signal based on the output data,
    wherein
    selection from among the pull-up sub-drivers is made by an assigned pull-up calibration signal and selection from among the pull-down sub-drivers by an assigned pull-down calibration signal so as to make a pull-up current drivability and a pull-down current drivability for the voltage at the output terminal equal to each other,
    a timing of turning on of the pull-up sub-drivers is calibrated by the pull-down calibration signal, and
    a timing of turning on of the pull-down sub-drivers is calibrated by the pull-up calibration signal.

2. The output driver circuit according to claim 1, wherein a timing of turning off the pull-up sub-drivers is calibrated by the pull-up calibration signal, and
    a timing of turning off the pull-down sub-drivers is calibrated by the pull-down calibration signal.

3. The output driver circuit according to claim 1, wherein the plurality of pull-up sub-drivers have different pull-up current drivabilities,
    the plurality of pull-down sub-drivers have different pull-down current drivabilities,
    the timing of turning on the pull-down sub-drivers is calibrated only by pull-up calibration signals assigned to one or more of the plurality of pull-up sub-drivers that have a higher current drivability, and
    the timing of turning on the pull-up sub-drivers is calibrated only by pull-down calibration signals assigned to one or more of the plurality of pull-down sub-drivers that have a higher current drivability.

4. The output driver circuit according to claim 1, wherein the plurality of pull-up sub-drivers have different pull-up current drivabilities,
    the plurality of pull-down sub-drivers have different pull-down current drivabilities,
    the timing of turning on the pull-up sub-drivers is calibrated by the pull-down calibration signal only in one or more of the plurality of pull-up sub-drivers that have a higher current drivability, and
    the timing of turning on the pull-down sub-drivers is calibrated by the pull-up calibration signal only in one or more of the plurality of pull-down sub-drivers that have a higher current drivability.

5. The output driver circuit according to claim 1, wherein the pull-up sub-driver comprises:
    a first logic circuit to which the assigned pull-up calibration signal and the pull-up signal are input;
    a first sub pMOS transistor that is connected to a power supply at a first end thereof and to an output of the first logic circuit at a gate thereof;
    a first sub nMOS transistor that is connected to a second end of the first sub pMOS transistor at a first end thereof and to the output of the first logic circuit at a gate thereof;
    a plurality of first calibrating nMOS transistors that are connected between a second end of the first sub nMOS transistor and a ground and each has a gate to which the assigned pull-down calibration signal is input; and a first main pMOS transistor that is connected to the power supply at a first end thereof, to the output terminal at a second end thereof, and to the first end of the first sub nMOS transistor at a gate thereof, and the pull-down sub-driver comprises:

a second logic circuit to which the assigned pull-down calibration signal and the pull-down signal are input;

a second sub nMOS transistor that is connected to the ground at a first end thereof and to an output of the second logic circuit at a gate thereof;

a second sub pMOS transistor that is connected to a second end of the second sub nMOS transistor at a first end thereof and to the output of the second logic circuit at a gate thereof;

a plurality of first calibrating pMOS transistors that are connected between a second end of the second sub pMOS transistor and the power supply and each has a gate to which the assigned pull-up calibration signal is input; and a first main nMOS transistor that is connected to the ground at a first end thereof, to the output terminal at a second end thereof, and to the first end of the second sub pMOS transistor at a gate thereof.

6. The output driver circuit according to claim 5, wherein the pull-up sub-driver further comprises:

a plurality of second calibrating pMOS transistors that are connected between the power supply and the first end of the first sub pMOS transistor and each has a gate to which the assigned pull-up calibration signal is input, and the pull-down sub-driver further comprises:

a plurality of second calibrating nMOS transistors that are connected between the ground and the first end of the second sub nMOS transistor and each has a gate to which the assigned pull-down calibration signal is input.

7. An output driver system, comprising:

an output driver circuit that outputs, at an output terminal, a data signal responsive to output data read from a memory core; and a calibrating circuit that calibrates a current drivability of the output driver circuit, wherein the output driver circuit comprises:

a plurality of pull-up sub-drivers that pull up a voltage at the output terminal according to a pull-up signal based on the output data; and a plurality of pull-down sub-drivers that pull down the voltage at the output terminal according to a pull-down signal based on the output data, selection from among the pull-up sub-drivers is made by an assigned pull-up calibration signal and selection from among the pull-down sub-drivers by an assigned pull-down calibration signal so as to make a pull-up current drivability and a pull-down current drivability for the voltage at the output terminal equal to each other, a timing of turning on of the pull-up sub-drivers is calibrated by the pull-down calibration signal, a timing of turning on of the pull-down sub-drivers is calibrated by the pull-up calibration signal, and the calibrating circuit outputs the pull-up calibration signal used to select any of the plurality of pull-up sub-drivers and the pull-down calibration signal used to select any of the plurality of pull-down sub-drivers so as to achieve a current drivability according to a reference resistance.

8. The output driver system according to claim 7, wherein the timing of turning off the pull-up sub-drivers is calibrated by the pull-up calibration signal, and the timing of turning off the pull-down sub-drivers is calibrated by the pull-down calibration signal.

9. The output driver system according to claim 7, wherein the plurality of pull-up sub-drivers have different pull-up current drivabilities, the plurality of pull-down sub-drivers have different pull-down current drivabilities, the timing of turning on the pull-down sub-drivers is calibrated only by pull-up calibration signals assigned to one or more of the plurality of pull-up sub-drivers that have a higher current drivability, and the timing of turning on the pull-up sub-drivers is calibrated only by pull-down calibration signals assigned to one or more of the plurality of pull-down sub-drivers that have a higher current drivability.

10. The output driver system according to claim 7, wherein the plurality of pull-up sub-drivers have different pull-up current drivabilities, the plurality of pull-down sub-drivers have different pull-down current drivabilities, the timing of turning on the pull-up sub-drivers is calibrated by the pull-down calibration signal only in one or more of the plurality of pull-up sub-drivers that has a higher current drivability, and the timing of turning on the pull-down sub-drivers is calibrated by the pull-up calibration signal only in one or more of the plurality of pull-down sub-drivers that have a higher current drivability.

11. The output driver system according to claim 7, wherein the pull-up sub-driver comprises:

a first logic circuit to which the assigned pull-up calibration signal and the pull-up signal are input;

a first sub pMOS transistor that is connected to a power supply at a first end thereof and to an output of the first logic circuit at a gate thereof;

a first sub nMOS transistor that is connected to a second end of the first sub pMOS transistor at a first end thereof and to the output of the first logic circuit at a gate thereof;

a plurality of first calibrating nMOS transistors that are connected between a second end of the first sub nMOS transistor and a ground and each have a gate to which the assigned pull-down calibration signal is input; and a first main pMOS transistor that is connected to the power supply at a first end thereof, to the output terminal at a second end thereof, and to the first end of the first sub nMOS transistor at a gate thereof, and the pull-down sub-driver comprises:

a second logic circuit to which the assigned pull-down calibration signal and the pull-down signal are input;

a second sub nMOS transistor that is connected to the ground at a first end thereof and to an output of the second logic circuit at a gate thereof;

a second sub pMOS transistor that is connected to a second end of the second sub nMOS transistor at a first end thereof and to the output of the second logic circuit at a gate thereof;

a plurality of first calibrating pMOS transistors that are connected between a second end of the second sub pMOS transistor and the power supply and each have a gate to which the assigned pull-up calibration signal is input; and a first main nMOS transistor that is connected to the ground at a first end thereof, to the output terminal at a second end thereof, and to the first end of the second sub pMOS transistor at a gate thereof.

12. The output driver system according to claim 11, wherein the pull-up sub-driver further comprises:
a plurality of second calibrating pMOS transistors that are connected between the power supply and the first end of the first sub pMOS transistor and each have a gate to which the assigned pull-up calibration signal is input, and
the pull-down sub-driver further comprises:
a plurality of second calibrating nMOS transistors that are connected between the ground and the first end of the second sub nMOS transistor and each have a gate to which the assigned pull-down calibration signal is input.

13. A semiconductor memory device, comprising:
a memory core that stores data;
an output driver circuit that outputs, at an output terminal, a data signal responsive to output data read from the memory core; and
a calibrating circuit that calibrates a current drivability of the output driver circuit,
wherein the output driver circuit comprises:
a plurality of pull-up sub-drivers that pull up a voltage at the output terminal according to a pull-up signal based on the output data; and
a plurality of pull-down sub-drivers that pull down the voltage at the output terminal according to a pull-down signal based on the output data,
selection from among the pull-up sub-drivers is made by an assigned pull-up calibration signal and selection from among the pull-down sub-drivers by an assigned pull-down calibration signal so as to make a pull-up current drivability and a pull-down current drivability for the voltage at the output terminal equal to each other,
a timing of turning on of the pull-up sub-drivers is calibrated by the pull-down calibration signal,
a timing of turning on of the pull-down sub-drivers is calibrated by the pull-up calibration signal, and
the calibrating circuit outputs the pull-up calibration signal used to select any of the plurality of pull-up sub-drivers and the pull-down calibration signal used to select any of the plurality of pull-down sub-drivers so as to achieve a current drivability according to a reference resistance.

14. The semiconductor memory device according to claim 13, wherein the timing of turning off the pull-up sub-drivers is calibrated by the pull-up calibration signal, and
the timing of turning off the pull-down sub-drivers is calibrated by the pull-down calibration signal.

15. The semiconductor memory device according to claim 13, wherein the plurality of pull-up sub-drivers have different pull-up current drivabilities,
the plurality of pull-down sub-drivers have different pull-down current drivabilities,
the timing of turning on the pull-down sub-drivers is calibrated only by pull-up calibration signals assigned to one or more of the plurality of pull-up sub-drivers that have a higher current drivability, and
the timing of turning on the pull-up sub-drivers is calibrated only by pull-down calibration signals assigned to one or more of the plurality of pull-down sub-drivers that have a higher current drivability.

16. The semiconductor memory device according to claim 13, wherein the plurality of pull-up sub-drivers have different pull-up current drivabilities,
the plurality of pull-down sub-drivers have different pull-down current drivabilities,
the timing of turning on the pull-up sub-drivers is calibrated by the pull-down calibration signal only in one or more of the plurality of pull-up sub-drivers that have a higher current drivability, and
the timing of turning on the pull-down sub-drivers is calibrated by the pull-up calibration signal only in one or more of the plurality of pull-down sub-drivers that have a higher current drivability.

17. The semiconductor memory device according to claim 13, wherein the pull-up sub-driver comprises:
a first logic circuit to which the assigned pull-up calibration signal and the pull-up signal are input;
a first sub pMOS transistor that is connected to a power supply at a first end thereof and to an output of the first logic circuit at a gate thereof;
a first sub nMOS transistor that is connected to a second end of the first sub pMOS transistor at a first end thereof and to the output of the first logic circuit at a gate thereof;
a plurality of first calibrating nMOS transistors that are connected between a second end of the first sub nMOS transistor and a ground and each have a gate to which the assigned pull-down calibration signal is input; and
a first main pMOS transistor that is connected to the power supply at a first end thereof, to the output terminal at a second end thereof, and to the first end of the first sub nMOS transistor at a gate thereof, and
the pull-down sub-driver comprises:
a second logic circuit to which the assigned pull-down calibration signal and the pull-down signal are input;
a second sub nMOS transistor that is connected to the ground at a first end thereof and to an output of the second logic circuit at a gate thereof;
a second sub pMOS transistor that is connected to a second end of the second sub nMOS transistor at a first end thereof and to the output of the second logic circuit at a gate thereof;
a plurality of first calibrating pMOS transistors that are connected between a second end of the second sub pMOS transistor and the power supply and each have a gate to which the assigned pull-up calibration signal is input; and
a first main nMOS transistor that is connected to the ground at a first end thereof, to the output terminal at a second end thereof, and to the first end of the second sub pMOS transistor at a gate thereof.

18. The semiconductor memory device according to claim 17, wherein the pull-up sub-driver further comprises:
a plurality of second calibrating pMOS transistors that are connected between the power supply and the first end of the first sub pMOS transistor and each have a gate to which the assigned pull-up calibration signal is input, and
the pull-down sub-driver further comprises:
a plurality of second calibrating nMOS transistors that are connected between the ground and the first end of the second sub nMOS transistor and each have a gate to which the assigned pull-down calibration signal is input.

* * * * *